(12) United States Patent
Planillo et al.

(10) Patent No.: US 9,337,392 B1
(45) Date of Patent: May 10, 2016

(54) NANOSCALE SOLID STATE GRAPHENE TERAHERTZ EMITTER

(71) Applicant: The United States of America as Represented by the Secretary of the Navy, Washington, DC (US)

(72) Inventors: Jordan Rudolph Pagayanan Planillo, Camarillo, CA (US); Michael A. Torres, Newbury Park, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/702,099

(22) Filed: May 1, 2015

(51) Int. Cl.
*H01L 29/06* (2006.01)
*H01L 29/08* (2006.01)
*H01L 33/34* (2010.01)
*H01L 33/24* (2010.01)
*H01L 29/16* (2006.01)

(52) U.S. Cl.
CPC .............. *H01L 33/34* (2013.01); *H01L 29/1606* (2013.01); *H01L 33/24* (2013.01)

(58) Field of Classification Search
CPC ...... H01L 29/1606; H01L 33/34; H01L 33/24
USPC .......................................................... 257/29
See application file for complete search history.

(56) References Cited

U.S. PATENT DOCUMENTS

| 2011/0108805 A1* | 5/2011 | Okai ............................. 257/26 |
| 2015/0228859 A1* | 8/2015 | Morreale ...................... 257/29 |

* cited by examiner

*Primary Examiner* — Fernando L Toledo
*Assistant Examiner* — Aaron Gray
(74) *Attorney, Agent, or Firm* — James M. Saunders

(57) ABSTRACT

A nanoscale solid state terahertz emitter employs a layered half-cylinder associated with a substrate. The half-cylinder is configured with a channel having a pre-determined channel length. The emitter is defined in a three-dimensional frame of reference. The layered half-cylinder includes a conductor layer bonded to the substrate. An insulator layer is bonded to the conductor layer. An arcuate-shaped graphene layer is bonded to the insulator layer along a pre-determined contact length.

14 Claims, 8 Drawing Sheets

NANOSCALE SOLID STATE GRAPHENE TERAHERTZ EMITTER

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to radio frequency (RF) emitters.

Figure 1A:
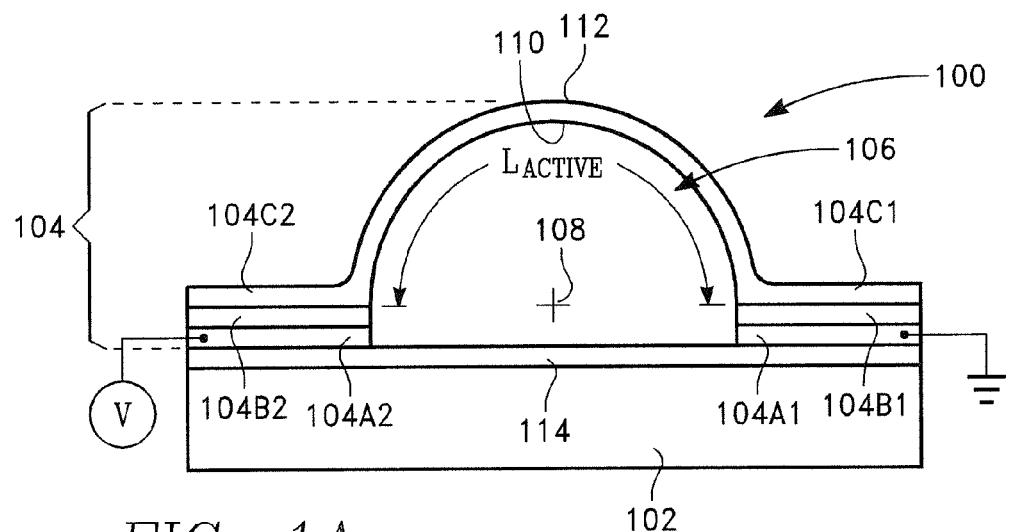
FIG. 1A is a front view of a first embodiment of a terahertz emitter, according to some embodiments of the invention.
Figure 1B:
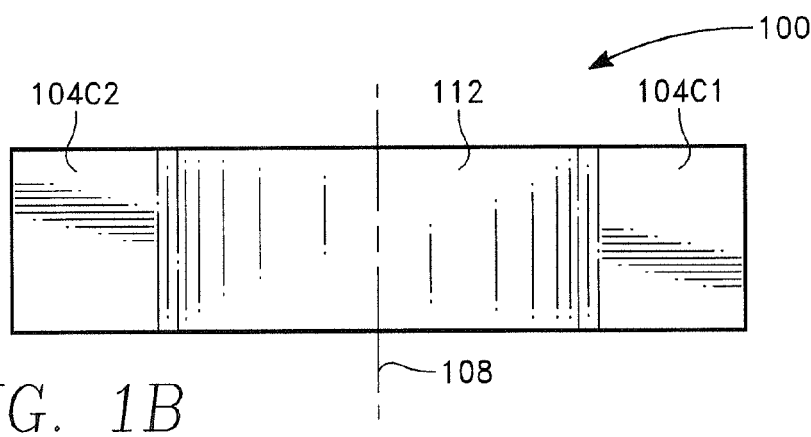
FIG. 1B is a top view of the terahertz emitter of FIG. 1A, according to some embodiments of the invention.
Figure 1C:
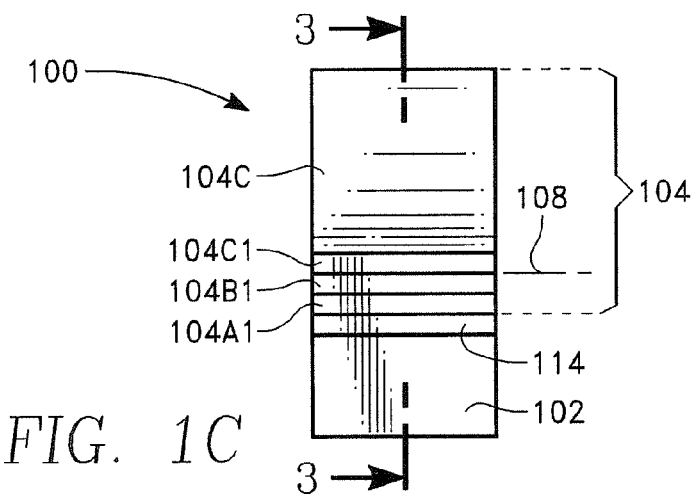
FIG. 1C is a side view of the terahertz emitter of FIG. 1A, showing cut plane 3-3 (section 3-3 is depicted in FIG. 3), according to some embodiments of the invention.
Figure 2:
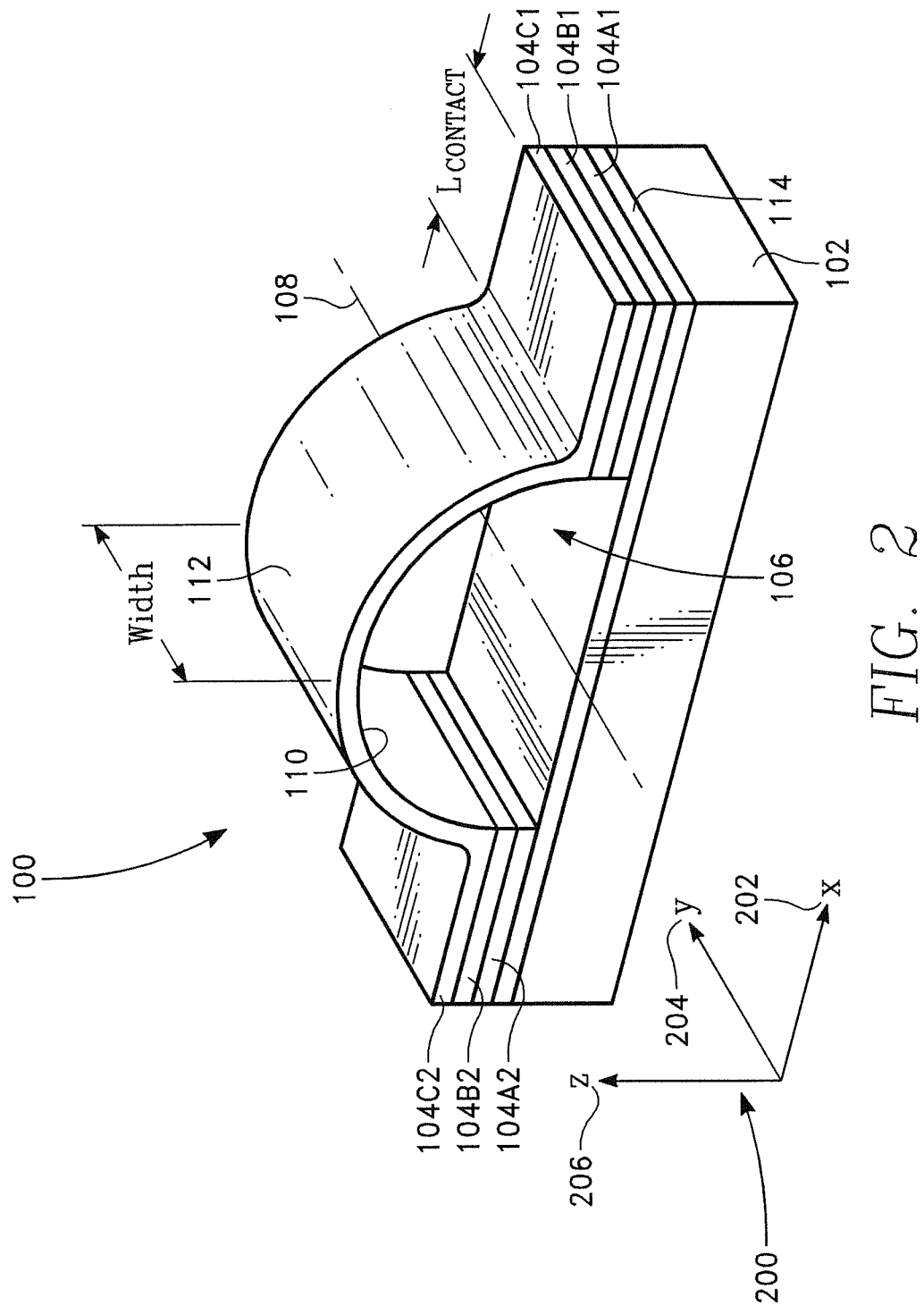
FIG. 2 is an isometric view of the terahertz emitter in FIG. 1A, according to some embodiments of the invention.
Figure 3:
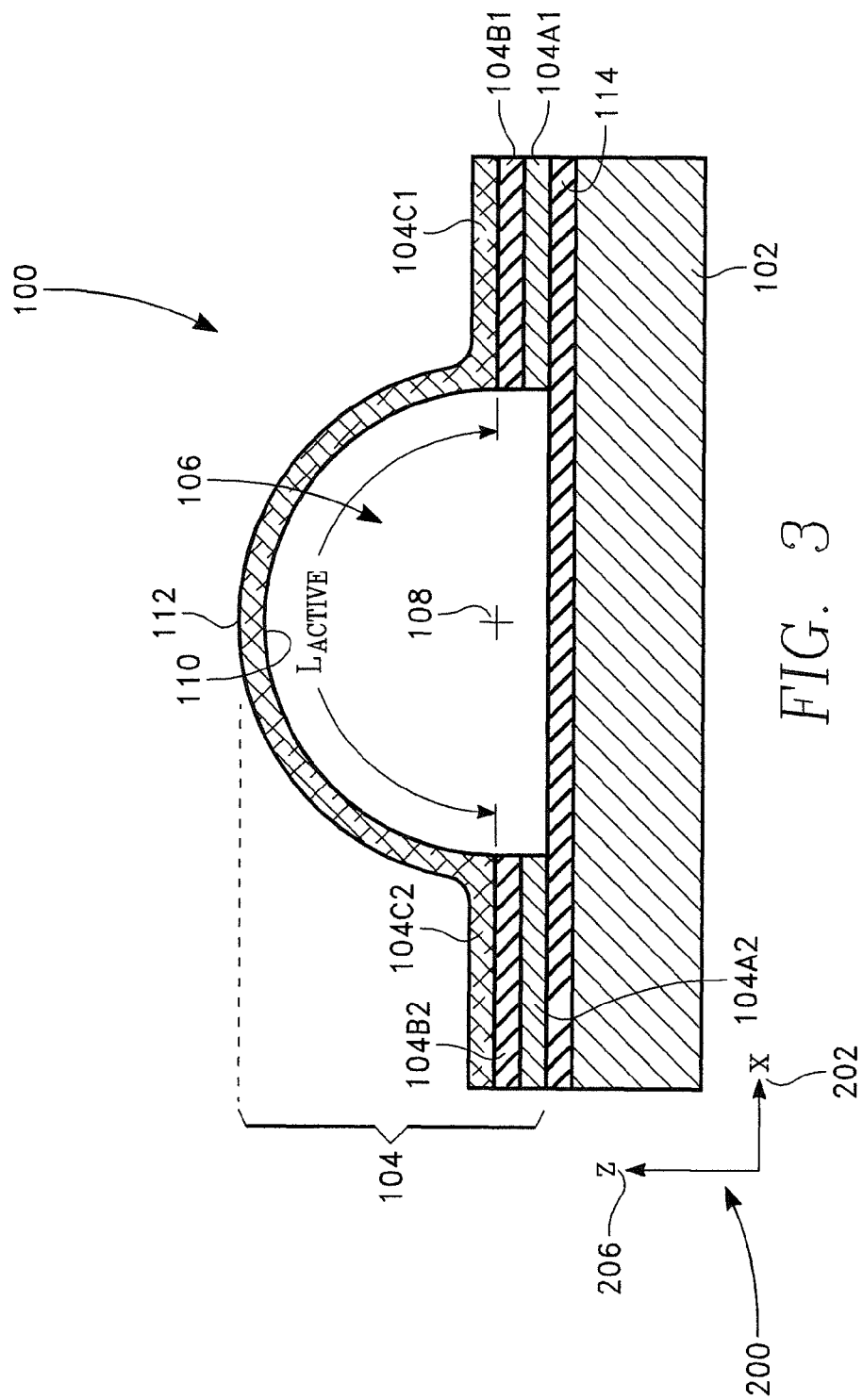
FIG. 3 is a section view perpendicular to cut plane 3-3 of FIG. 1C, according to some embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

Embodiments of the invention generally relate to RF emitters and, more particularly, terahertz emitters. Embodiments provide precise and stable terahertz RF emitters for ultra high speed computers, high precision scanners, RADAR(s), RF detectors, antennas, pulse generators, scanning devices, and imaging through opaque objections without the use of ionizing radiation. Embodiments disclose a solid state device configured for these uses.

A voltage is applied to external contact electrodes. The external voltage produces a voltage difference on a half-cylinder piece of graphene. The voltage causes electrons to drift along the cylinder in the direction of the voltage difference. The velocity of the electrons is limited by the mobility of the electrons in graphene. The number of carriers is also limited by temperature and number of available carriers in graphene. The motion of the electrons results in radiated energy normal to the surfaces of the cylinder. The power and frequency of the radiation are controlled by the device dimensions yielding a very stable emitter. Additionally, a person having ordinary skill in the art will recognize that the geometry of an antenna/emitter directly affects efficiencies and frequency ranges of the device.

In the accompanying drawings, like reference numbers indicate like elements. Reference characters 100 and 400 are used to depict an apparatus of embodiments of the invention. Several views are presented to depict some, though not all, of the possible orientations of embodiments of the inventions. Additionally, some drawings illustrate section views showing various hatching for ease of view and should not be construed as being limiting to particular materials.

In embodiments, the apparatus 100 & 400 is modeled as being surrounded by air, also sometimes referred to as free space. Other surrounding materials such as, for example, water or oil, may also be used depending on application specific-conditions. The various embodiments disclose material layers that are associated with adjacent layers by bonding. It is understood that bonding includes several bonding methods known to those having ordinary skill in the art, including, but not limited to mechanical bonding, chemical bonding, van der Waals bonding, dipole interaction, and ionic bonding.

Embodiments disclose semiconductor materials, such as substrates. Those having ordinary skill in the art will recognize that a substrate may comprise single element semiconductor materials such as silicon, class III-V semiconductors, class II-VI semiconductors, binary semiconductors, ternary semiconductors, and organic semiconductors.

Likewise, embodiments disclose graphene layers. It is understood that graphene is a material that is more than 95 percent carbon by weight and includes at least one, one-atom-thick planar layer comprised of sp2-bonded carbon atoms that are densely packed in a honeycomb crystal lattice and held together by strong Van der Waals forces. The material may contain one layer of carbon atoms or a plurality of layers of carbon atoms.

Referring to FIGS. 1A, 1B, 1C, 2, & 3, embodiments of the invention are directed to an emitter having a substrate 102. In some embodiments, the substrate 102 is a semiconductor substrate. In other embodiments, the substrate 102 is silicon. In still other embodiments, the substrate 102 is a doped silicon. A layered half-cylinder is depicted with reference character 104. As shown and described below, the layered half-cylinder includes reference characters 104A, 104B, and 104C. The layered half-cylinder cylinder 104 is bonded to the substrate 102.

In particular, the layered half-cylinder is has a conductor layer 104A, an insulator layer 104B, and an arcuate-shaped graphene layer 104C. The layered half-cylinder 104 is configured with a channel 106 having a pre-determined channel length. The substrate 102 and layered half-cylinder 104 are defined in a three-dimensional coordinate frame of reference 200 (FIG. 2) defined by an x-axis 202, a y-axis 204, and a z-axis 206. A central longitudinal axis 108 is centered at an origin of the three-dimensional coordinate frame of reference 200.

In the layered half-cylinder 104, the conductor layer 104A is bonded to the substrate 102. The insulator layer 104B is bonded to the conductor layer 104A. The arcuate-shaped graphene layer 104C is bonded to the insulator layer 104B. The arcuate shaped graphene layer is shaped like a bow, which is a known to one having ordinary skill in the art as a definition of arcuate. Additionally, the arcuate-shaped graphene layer 104C has first 110 and second 112 surfaces. From referring to FIGS. 1A, 1B, 2, and 3, the first 110 and second 112 surfaces are the lower/inner and upper/outer surfaces, respectively, of the arcuate-shaped graphene layer 104C. It is apparent from viewing FIGS. 1A, 1B, 2, and 3 that the channel 106 is bounded by the first surface 110 of the arcuate-shaped graphene layer 104C, the first 104B1 and second 104B2 portions of the insulator layer 104B, and the first 104A1 and second 104A2 portions of the conductor layer 104A. In some embodiments, the substrate 102 is the bottom boundary of the channel 106. In other embodiments, a supplementary SiO₂ insulator layer 114 is the bottom boundary of the channel 106.

The conductor layer 104A and the insulator layer 104B in the layered half-cylinder 104 each have two portions. As shown in FIGS. 1A, 1B, 2, and 3, the conductor layer 104A has a first portion 104A1 and a second portion 104A2. Similarly, the insulator layer 104B has a first portion 104B1 and a second portion 104B2. The first portion 104A1 and the second portion 104A2 of the conductor layer 104A are positioned diametrically-opposed from each other, with the channel 106 being the separating structure. Similarly, the first portion 104B1 and the second portion 104B2 of the insulator layer 104B are positioned diametrically-opposed from each other, with the channel 106 being the separating structure.

The arcuate-shaped graphene layer 104C is a single structural element having first 104C1 and second 104C2 tabs. The first tab 104C1 and the second tab 104C2 are the ends of the arcuate-shaped graphene layer 104C and are diametrically-opposed from each other, on opposite sides of the channel 106. The first 104C1 and second 104C2 tabs are bonded to the insulator layer 104B. As shown, the first 104C1 and second 104C2 tabs are bonded to the first 104B1 and second 104B2 portions, respectively, of the insulator layer 104B. The pre-determined contact length is defined by $L_{Contact}$ and is a range of about 10 to 100 nanometers along the x-axis 202. The contact length, $L_{Contact}$, is the length of the bonding interface between the first 104C1 and second 104C2 tabs of the graphene layer 104C to the first 104B1 and second 104B2 portions, respectively, of the insulator 104B.

The arcuate-shaped graphene layer 104C has a width range, Width, of about 10 to 100 nanometers along the y-axis 204. The substrate 102 and additional layers of the layered half-cylinder 104 may be varying lengths, however, for ease of manufacturing, the substrate and additional layers of the layered half-cylinder also shown as being about 10 to 100 nanometers, as measured along the y-axis 204.

The first surface 110 is bonded to the insulator layer 104B along a pre-determined contact length. The pre-determined channel length corresponds to a distance between the diametrically-opposing sides of the first surface 110 of the arcuate-shaped graphene layer 104C as measured perpendicular to the central longitudinal axis 108.

In some embodiments, the supplementary SiO₂ insulator layer 114 is positioned between the substrate 102 and the conductor layer 104A to electrically-isolate the conductor layer from the substrate, such as in when the substrate is a doped silicon. The supplementary SiO₂ insulator layer 114 has a layer height range along the z-axis 206 of about 1 to 2 micrometers. The conductor layer 104A has a layer height range along the z-axis 206 of about ½ to 1 micrometers. The insulator layer 104B is a SiO₂ layer having a layer height range along the z-axis of about 1 to 2 micrometers.

In embodiments of the invention, the channel 106 & 406 is a semi-circular channel. For the embodiment shown in FIGS. 1A through 3, the arcuate-shaped graphene layer 104C has the active length, $L_{Active}$, along the first surface 110 in the x-z plane and is defined by a radius of curvature, $R_C$, where $L_{Active} = \pi R_C$. The active length, $L_{Active}$, is the arc length of the first surface 110 and is a range of about 100 to 1500 nanometers. Additionally, the pre-determined channel length of the half-cylinder is defined as $$2R_C = 2\frac{L_{Active}}{\pi},$$

perpendicular to the central longitudinal axis 108.

The first surface 110 is bonded to the insulator layer 104B along a pre-determined contact length. The pre-determined channel length corresponds to a distance between the diametrically-opposing sides of the first surface 110 of the arcuate-shaped graphene layer 104C as measured perpendicular to the central longitudinal axis 108.

Figure 4A:
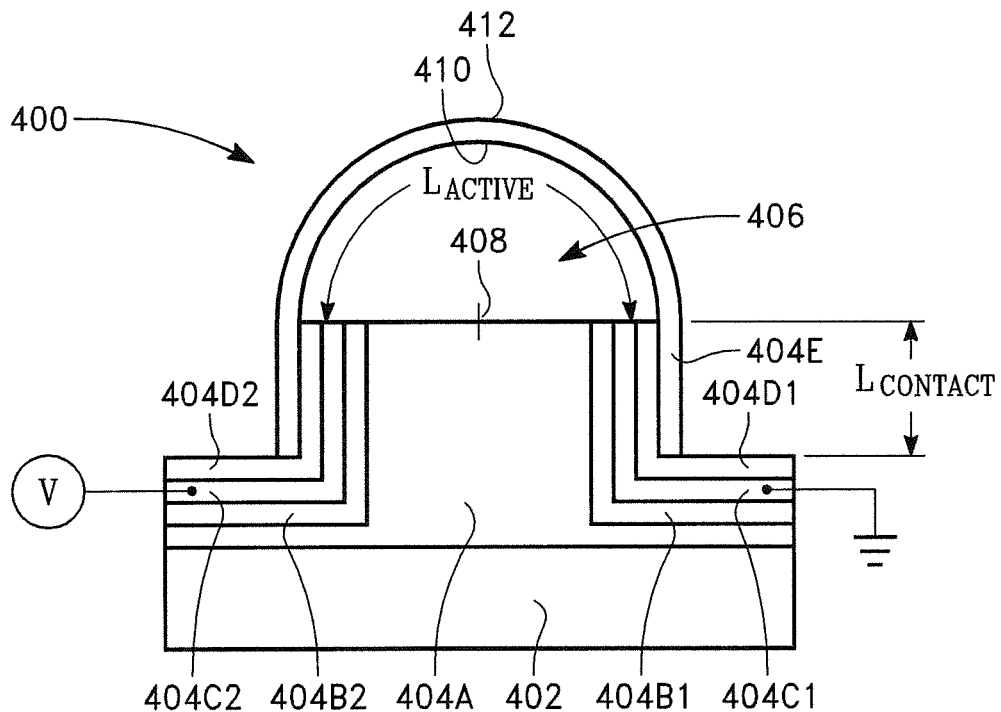
FIG. 4A is a front view of a second embodiment of a terahertz emitter, according to some embodiments of the invention.
Figure 4B:
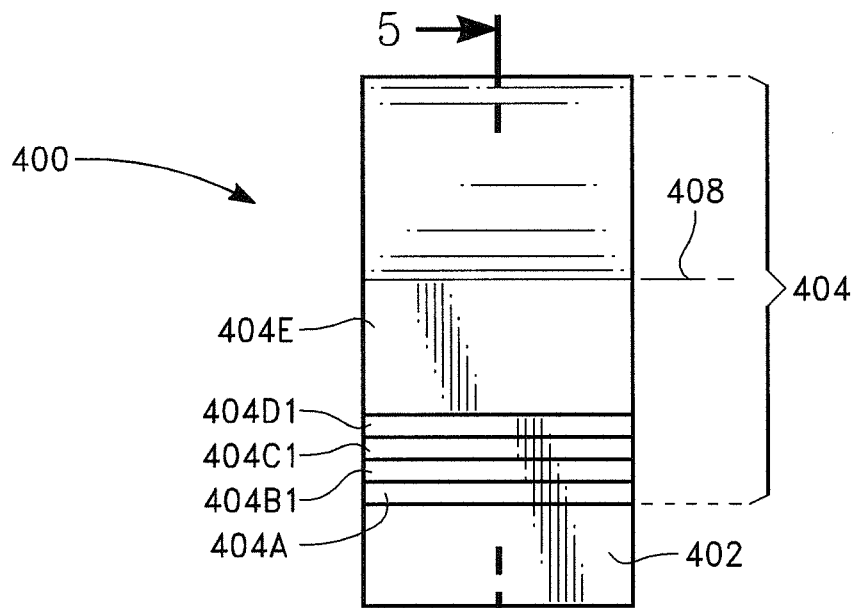
FIG. 4B is a side view of the terahertz emitter in FIG. 4A, showing cut plane 5-5 (section 5-5 is depicted in FIG. 5), according to some embodiments of the invention.
Figure 4C:
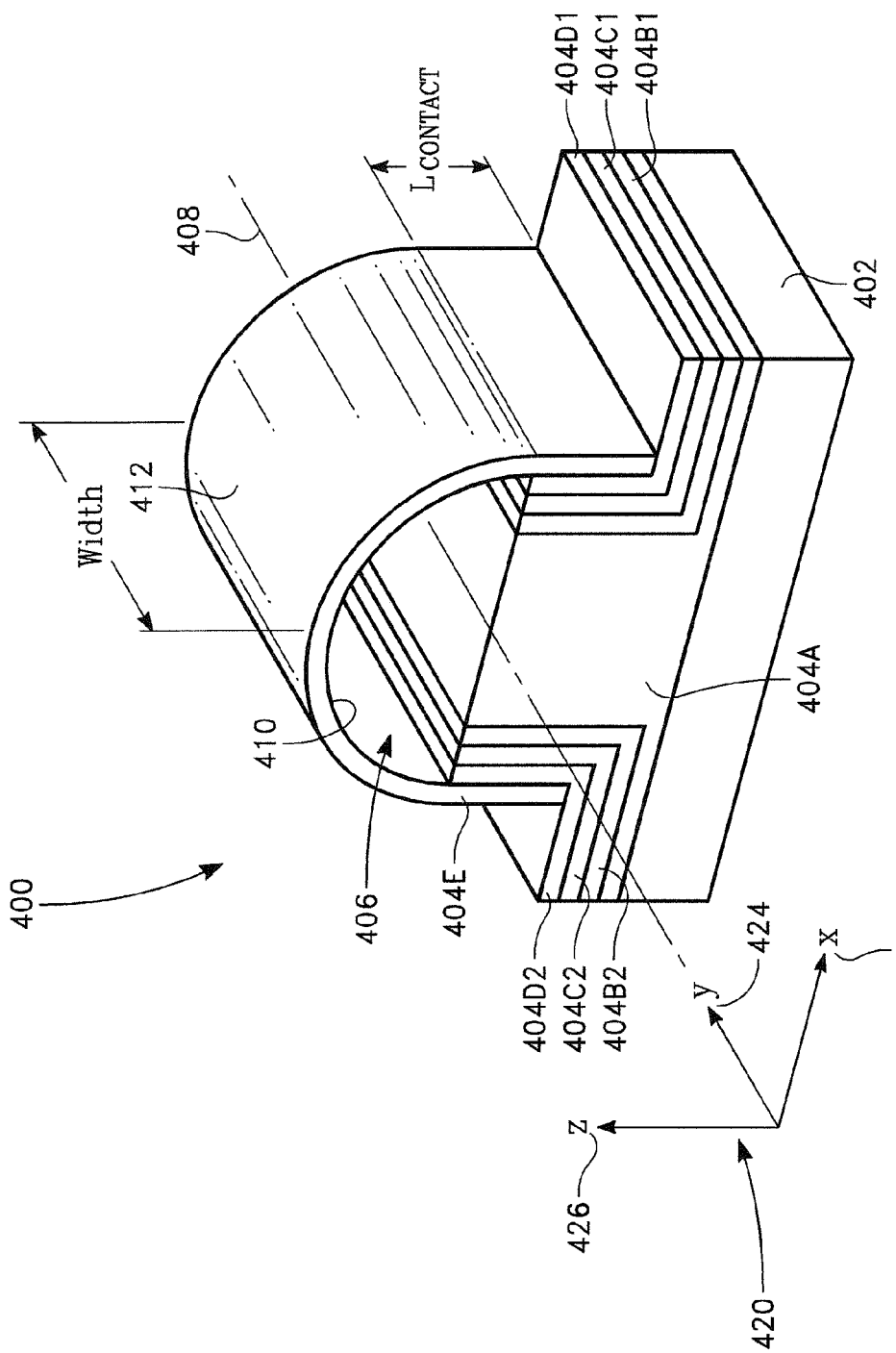
FIG. 4C is an isometric view of the terahertz emitter in FIG. 4A, according to some embodiments of the invention.

Another embodiment of the invention is shown in FIGS. 4A, 4B, & 4C. An emitter 400 has a doped silicon substrate 402. A layered half-cylinder is depicted with reference character 404. As shown and described below, the layered half-cylinder includes reference characters 404A, 404B, 404C, 404D, and 404E. The layered half-cylinder 404 is bonded to the doped silicon substrate 402.

The layered half-cylinder 404 is configured with a channel 406 having a pre-determined channel length. The doped silicon substrate 402 and the layered half-cylinder 404 are defined in a three-dimensional coordinate frame of reference 420 defined by an x-axis 422, a y-axis 424, and a z-axis 426. A central longitudinal axis 408 is centered at an origin of the three-dimensional coordinate frame of reference 420.

Figure 5:
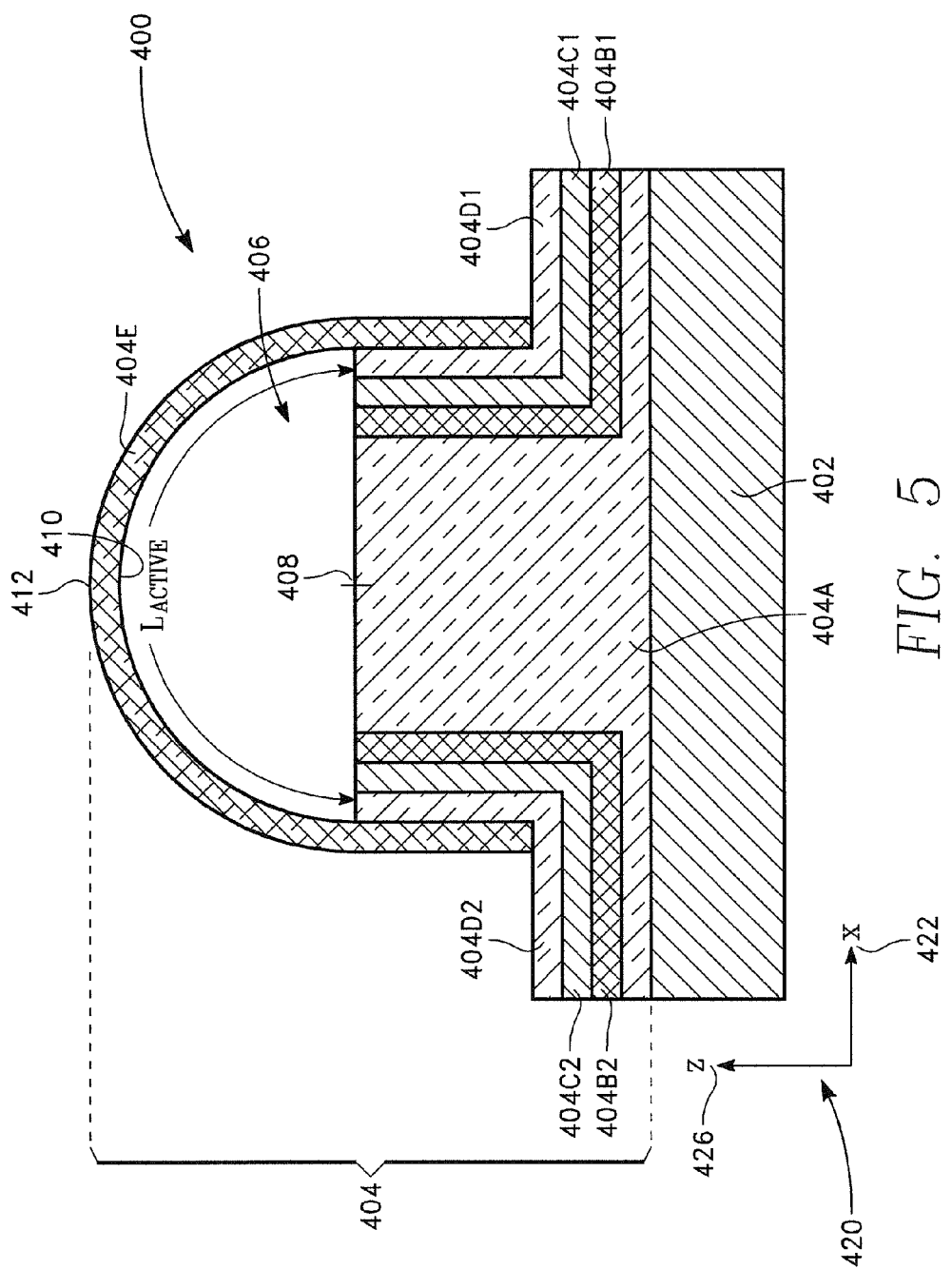
FIG. 5 is a section view perpendicular to cut plane 5-5 of FIG. 4B, according to some embodiments of the invention.

The layered half-cylinder 404 includes a cross-sectionally reversed T-shaped deposited silicon layer 404A bonded to the doped silicon substrate 402. As depicted in FIGS. 4A, 4C, and 5, the cross-sectionally reversed T-shaped deposited silicon layer 404A is, as viewed in the associated figures, an upside down T-shape. The layered half-cylinder 404 also includes an insulator layer 404B, a conductor layer 404C, a grown SiO₂ layer 404D, and a C-shaped graphene arch layer 404E. The layered half-cylinder is configured with a channel 406 having a pre-determined channel length.

In the layered half-cylinder 404, the insulator layer 404B, the conductor layer 404C, and the grown SiO₂ layer 404D have two portions, depicted as reference characters 404B1/404B2, 404C1/404C2, and 404D1/404D2, respectively. Additionally, each portion, as discussed below has a horizontal and vertical portion making an L-shape. As is apparent from the respective figures, the horizontal and vertical portions of respective L-shapes form right angles.

A first L-shaped insulator layer 404B1 and a second L-shaped insulator layer 404B2 each have a horizontal and vertical portion. The first and second L-shaped insulator layers 404B1 & 404B2 are bonded to the cross-sectionally reversed T-shaped deposited silicon layer 404A. The horizontal and the vertical portions of the first and the second L-shaped insulator layers 404B1 & 404B2 are positioned in intimate adjacent contact with the cross-sectionally reversed T-shaped deposited silicon layer 404A such that the horizontal and vertical portions of the first and the second L-shaped insulator layers are positioned outwardly away and diametrically-opposed from each other and separated by the cross-sectionally reversed T-shaped deposited silicon layer.

Similarly, a first L-shaped conductor layer 404C1 and a second L-shaped conductor layer 404C2 have a horizontal and vertical portion. The first and second L-shaped conductor layers 404C1 & 404C2 are bonded to the first and second L-shaped insulator layers 404B1 & 404B2, respectively. The horizontal and vertical portions of the first and second L-shaped conductor layers 404C1 & 404C2 are positioned in intimate adjacent contact with the first and second L-shaped insulator layers 404B1 & 404B2, respectively. The horizontal and vertical portions of the first and second L-shaped conductor layers 404C1 & 404C2 are positioned outwardly away and diametrically-opposed from each other.

A first L-shaped silicon layer 404D1 and a second L-shaped silicon layer 404D2 have a horizontal and a vertical portion. Each of the first and second L-shaped silicon layers 404D1 & 404D2 are grown silicon dioxide and form a silicon dioxide gate and set the gate thickness because they are fixed insulators. A person having ordinary skill in the art will recognize that grown silicon dioxide is a thermal oxidation method of producing a thin layer of silicon dioxide on the surface of a silicon substrate. The technique forces an oxidizing agent to diffuse into the substrate at high temperature and react with it.

A person having ordinary skill in the art will also recognize that fixed insulators are thermally (time and temperature) controlled insulator thickness layers used for the purpose of controlling the electric field coupling between conductors. Furthermore, a person having ordinary skill in the art will recognize that gate thickness is the distance between two conductors and is controlled by insulator layer thickness.

Each of the first and second L-shaped silicon layers 404D1 & 404D2 are bonded to the first and second L-shaped conductor layers 404C1 & 404C2, respectively. The corresponding horizontal and vertical portions of the first and second L-shaped silicon layers 404D1 & 404D2 are positioned in intimate adjacent contact with the first and second L-shaped conductor layers 404C1 & 404C2, respectively. Additionally, as shown in FIGS. 4A, 4C, & 5, the corresponding horizontal and vertical portions of the first and second L-shaped silicon layers 404D1 & 404D2 are positioned outwardly away and diametrically-opposed from each other.

The C-shaped graphene arch layer 404E has a first surface 410 and a second surface 412. The C-shaped graphene arch layer 404E is bonded to the first and second silicon layers 404D1 & 404D2 along the interface between the inner surface 410 of the C-shaped graphene layer and each of the vertical portions of the first and second L-shaped silicon layers 404D1 & 404D2. The interface between the inner surface 410 of the C-shaped graphene layer 404E and the vertical portions of the first and second L-shaped silicon layers 404D1 & 404D2 is a pre-determined contact length, $L_{Contact}$, having a range of about 10 to 100 nanometers along the z-axis. Stated another way, the interface is the region between the inner surface 410 and the outer edges (the edges adjacent to the inner surface of the C-shaped arch layer) of the vertical portions of each of the first and second L-shaped silicon layers 404D1 & 404D2. The channel 406 has a pre-determined channel length corresponding to a distance between diametrically-opposing sides of the first surface 410 of the C-shaped graphene arch layer 404E as measured perpendicular to the central longitudinal axis 408. The C-shaped graphene arch layer has a width range in the y-direction of about 10 to 100 nanometers.

The horizontal portions of the first and second L-shaped conductor layers 404C1 & 404C2 have a layer height range along the z-axis of about ½ to about 1 micrometers. Likewise, the vertical portions of the first and second L-shaped conductor layers 404C1 & 404C2 have a layer length range along the x-axis of about ½ to about 1 micrometers.

The horizontal portions of the first and second L-shaped silicon layers 404D1 & 404D2 have a layer height range along the z-axis of about 1 to about 2 micrometers. Similarly, the vertical portions of the first and second L-shaped conductor layers 404C1 & 404C2 have a layer length range along the x-axis of about 1 to about 2 micrometers. The horizontal portions of the first and second L-shaped insulator layers 404B1 & 404B2 have a layer height range along the z-axis of about 1 to about 2 micrometers. Similarly, the vertical portions of the first and second L-shaped insulator layers 404B1 & 404B2 have a layer length along the x-axis of about 1 to about 2 micrometers.

It is apparent from viewing FIGS. 4A, 4C, & 5 that the channel 406 is bounded by the inner surface 410 of the C-shaped graphene layer 404E, and: i) the upper surfaces of the vertical portions of first and second L-shaped silicon layers 404D1 & 404D2; ii) the upper surfaces of the vertical portions of the first and second L-shaped conductor layers 404C1 & 404C2; iii) the upper surfaces of the vertical portions of the first and second L-shaped insulator layers 404B1 & 404B2; and iv) the upper surface of the cross-sectionally reversed T-shaped deposited silicon layer 404A.

In embodiments of the invention, the conductor layers 104A & 404C, including the further layer delineations illustrated by reference characters 104A1, 104A2, 404C1, & 404C2 may include any conductive materials known in the art such as, for example, aluminum, copper, and polysilicon. The insulator layers 104B1, 104B2, 114, 404B1, & 404B2, as depicted in embodiments of the invention, are silicon dioxide. However, other appropriate insulator materials are also envisioned as the technology advances. For the depicted embodiments, the channel 106/406 is a void and is semi-circular in shape. The C-shaped graphene layer 404E has an active length, $L_{Active}$, along the first surface 110/410 in the x-z plane and is defined by a radius of curvature, $R_C$. The active length, $L_{Active} = \pi R_C$. The active length, $L_{Active}$, is a range of about 100 to 1500 nanometers. Additionally, the pre-determined channel length of the half-cylinder is defined as $$2R_C = 2\frac{L_{Active}}{\pi},$$

as measured perpendicular to the central longitudinal axis 108/408.

Figure 6:
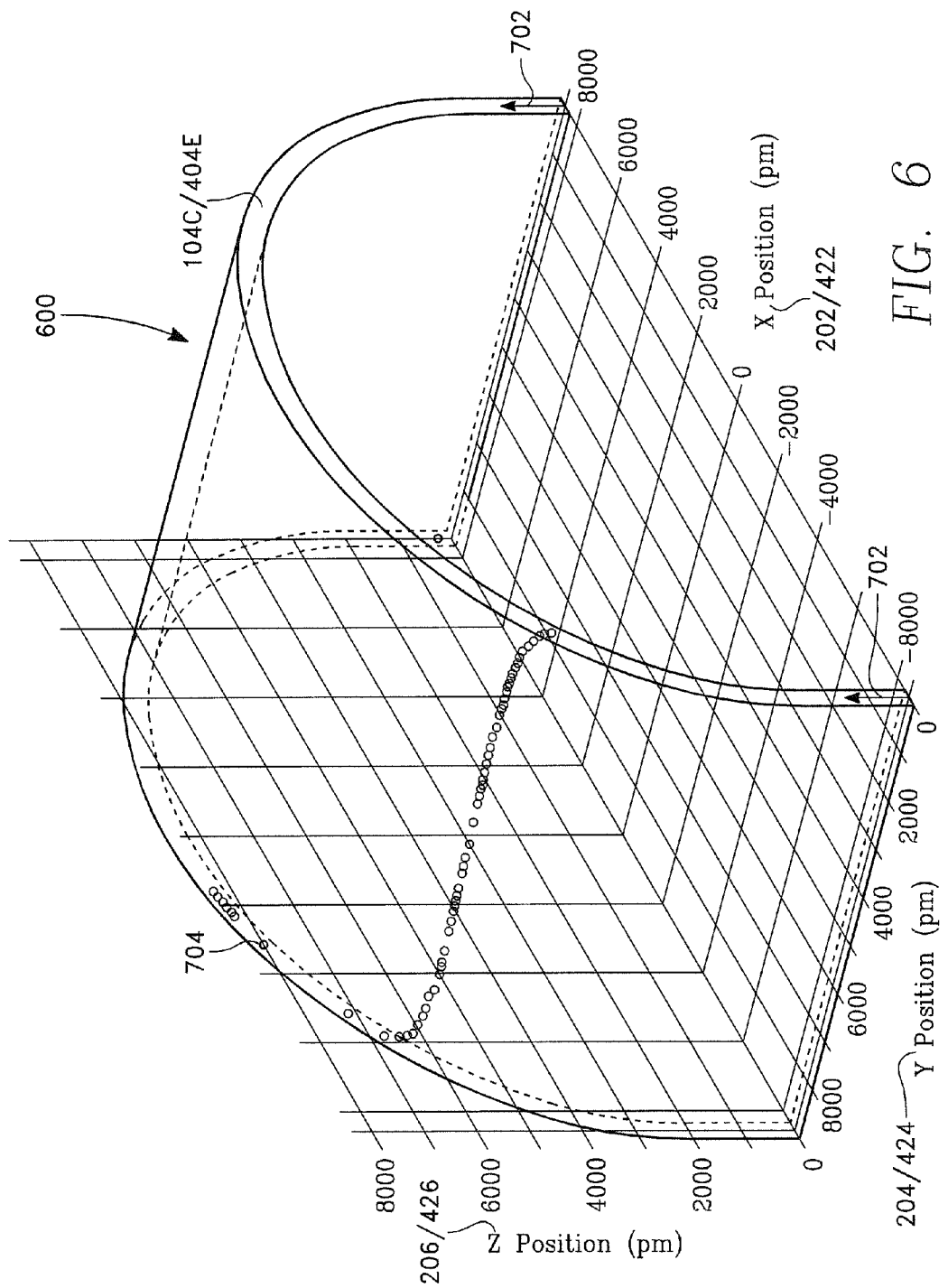
FIG. 6 is a modeled isometric view analytically depicting free electron drift positions in a graphene layer at a first time period, $t_1$, according to some embodiments of the invention.
Figure 7:
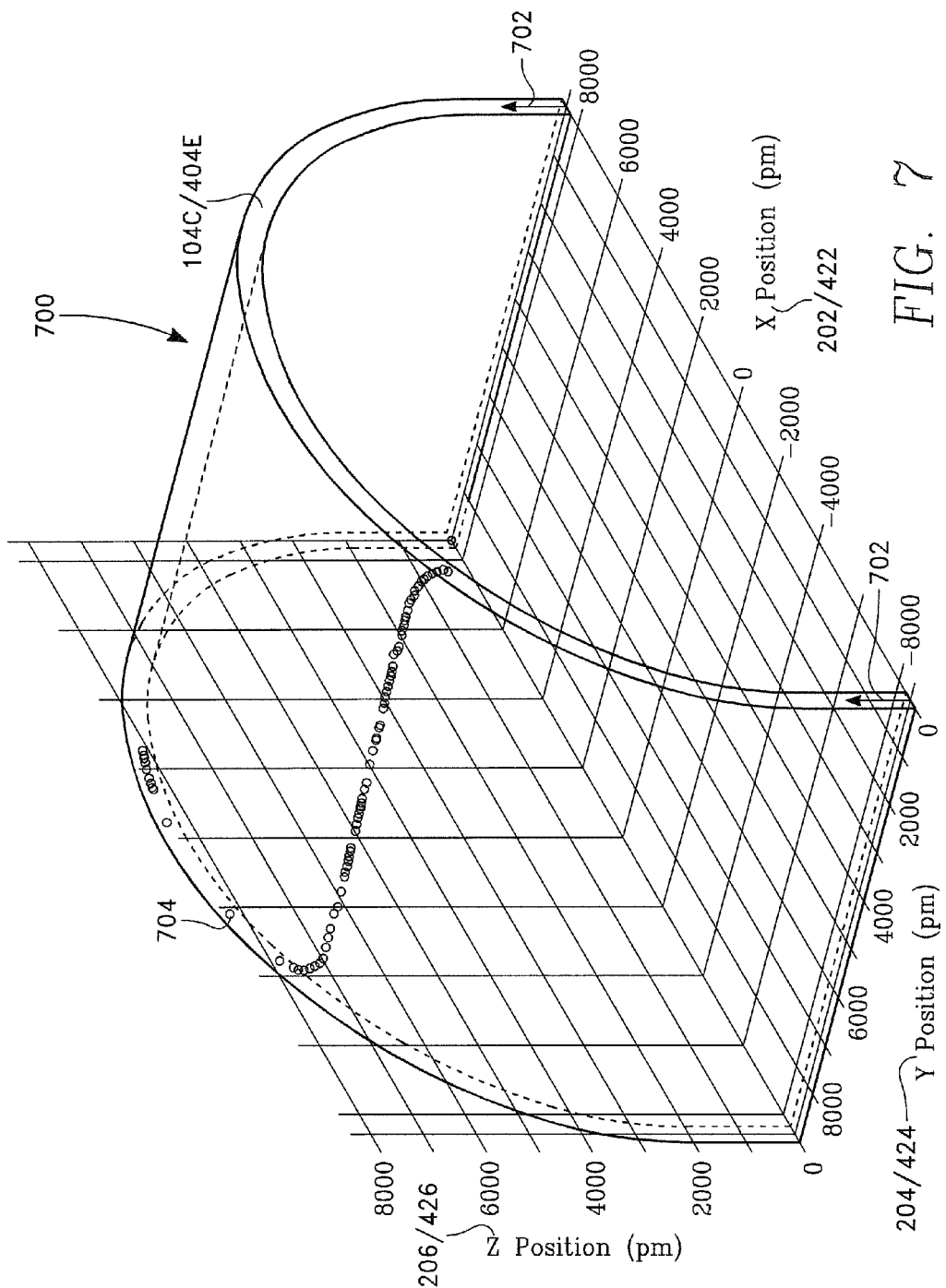
FIG. 7 is a modeled isometric view analytically depicting free electron drift positions in a graphene layer at a second time period, $t_2$, according to some embodiments of the invention.

Significant analytical modeling was performed. Some of the analytical modeling is shown in FIGS. 6 & 7. FIG. 6 is a modeled isometric view, depicted with reference character 600, analytically depicting free electron drift positions in the graphene layer 104C/404E at a first time period, $t_1$. FIG. 7 is a modeled isometric view, depicted with reference character 700, analytically depicting free electron drift positions in the graphene layer 104C/404E at a second time period, $t_2$. FIGS. 1A & 4A illustrate a voltage source and ground and, when powered, embodiments of the invention cause terahertz radiation to emit in the y-direction (along the y-axis 204/424) as electrons 704 move back and forth along the graphene layer. The electrons 704 are referred to as free electrons. As such, radiation emits from all dimensions that are perpendicular to the motion of the free electrons 704. The strongest field is at the center of the layered half-cylinder 104/404 and, specifically, the respective graphene layer 104C/404E, in the y-direction because all field contributions accumulate there in the same direction.

As shown in FIGS. 6 & 7, embodiments of the invention allow for accuracy down to a part of a picometer and for objects to be mapped down to as small as a nanometer. The movement is shown as a series of electrons 704 with arrows 702 illustrating that the electrons reverse direction when coming to an end of the graphene layer 104C/404E. The graphene layer 104C/404E is measured in Carbon atoms height. A minimum layer of graphene for embodiments of the invention is a single plane of carbon atoms having a thickness of about 0.5 nanometers. A typical graphene layer can range from 1 to 10 carbon atoms or about 0.5 nanometers to about 5 nanometers. In embodiments of the invention, the stack height for the graphene layer 104C/404E, as measured in the z-direction along the z-axis 206/426 is a range of about 0.5 nanometers to about 5 nanometers. Prophetic calculations for graphene layer 104C/404E associated with embodiments of the invention are found below.

The frequency is determined from Equation 1:

$$f = \frac{3v}{4\pi R_C}[2(1-\beta)]^{\frac{3}{2}} = \frac{3v}{4L_{Active}}[2(1-\beta)]^{\frac{3}{2}}. \tag{1}$$

The frequency, f, is the frequency measured in terahertz (THz). The electron velocity, v, has units of centimeters per second (cm/s). The ratio of electron speed of light, $\beta$, is given by Equation 2:

$$\beta = \frac{v}{c}. \tag{2}$$

$$v = 4.25 \times 10^7 \text{cm/s} \rightarrow \beta = \frac{v}{c} \approx 0.001 \rightarrow \left[[2(1-\beta)]^{\frac{3}{2}}\right] \approx 1$$

Thus, for graphene, $$f = \frac{3.1875}{L_{Active}(\text{nm})} \times 10^{14} \text{ Hz} = \frac{318.75}{L_{Active}(\text{nm})} \text{THz}.$$

and

The low range, mid-range, and high range frequencies of interest are as follows: $f_{LOW}$=0.3 THz $f_{MID}$=1.5 THz $f_{HIGH}$=3.0 THz. Determining the corresponding active lengths for the respective frequencies is determined by Equation 3:

$$L_{Active} = \frac{318.75}{f(\text{THz})} \text{nm}. \tag{3}$$

Based on this, it can be determined that the following active lengths corresponding to their respective frequencies is as follows: $L_{Active}(f_{low})$=1062.5 nm, $L_{Active}(f_{MID})$=212.5 nm, and $L_{Active}(f_{HIGH})$=106.25 nm.

The response time for two capacitors in series is determined by Equation 4:

$$\tau = \frac{1}{2}CR. \tag{4}$$

In Equation 4, C is capacitance and R is resistance. The capacitance as a function of permittivity of the material, $\epsilon_r$, and the permittivity of free space, $\epsilon_0$. Radius is represented by R, conductivity as $\sigma$, and the insulator thickness as $d_{separation}$. The response time, $\tau$, is then determined by using Equations 5 and 6 for capacitance and resistance, respectively, and then solving Equation 4 for the response time.

The capacitance is determined by:

$$C = \epsilon_r \epsilon_0 \frac{A_{contact}}{d} \tag{5}$$

where $\epsilon_r(SiO_2)$=3.9 and $$\epsilon_0 = 8.854 \times 10^{-3} \frac{F}{\text{nm}}.$$

Therefore, $$C = 3.9 \times 8.854 \times 10^{-21}\left(\frac{F}{\text{nm}}\right)\frac{\text{Width(nm)} \times L_{contact}(\text{nm})}{d_{separation}(\text{nm})}.$$

Resistance is determined by:

$$R = \frac{1}{\sigma A_{strip}} \tag{6}$$

where $$\sigma = 3.3 \times 10^5 \frac{s}{\text{cm}^2}.$$

Equation 6 then yields:

$$R = \frac{10^9}{(3.3)(\text{Width(nm)} \times L_{Active}(\text{nm}))} \Omega.$$

The response time is then determined by substituting into Equation 4, such that:

$$\tau = \frac{1}{2} \times 3.9 \times 8.854 \times 10^{-21}\left(\frac{F}{\text{nm}}\right)$$

$$\frac{\text{Width(nm)} \times L_{contact}(\text{nm})}{d_{separation}(\text{nm})} \times \frac{10^9}{(3.3)(\text{Width(nm)} \times L_{Active}(\text{nm}))} \Omega.$$

$$= \frac{3.9 \times 8.854}{2 \times 3.3}\left(\frac{L_{contact}(\text{nm})}{d_{separation}(\text{nm}) \times L_{Active}(\text{nm})}\right) \times 10^{-12} \text{sec}.$$

Therefore, the response time can be expressed as shown in Equation 7 as:

$$\tau = 5.23\left(\frac{L_{contact}(nm)}{d_{separation}(nm) \times L_{Active}(nm)}\right) \times 10^{-12} sec. \quad (7)$$

The total radiated power, $P_{rad}$, is determined by knowing the electron charge, e, velocity, v, the β ratio, radius of curvature, $R_C$, number of free electrons, N, and the electron density, n. The total radiated power, $P_{rad}$, is then determined with Equation 8:

$$P_{rad} = \frac{2}{3}\frac{q^2}{c^3}\left|\frac{v^2}{R_C}\right|^2 \gamma^4, \quad (8)$$

where $$\gamma = \frac{1}{\sqrt{1-\beta^2}} \approx 1.$$

continuing, the total radiated power, $P_{rad}$, may, therefore, be expressed as shown in Equation 9:

$$P_{rad} = \frac{2}{3}\frac{(N \times e)^2}{c^3}\left|\frac{v^2}{R_C}\right|^2 \quad (9)$$

where $$e = -4.8 \times 10^{-10} statC \text{ and } v = 4.25 \times 10^7 \frac{cm}{s}.$$

Substituting, into Equation 9 yields:

$$P_{rad} = 1.856\left(\frac{N}{R_C}\right)^2 \times 10^{13} W.$$

Continuing, the number of free electrons may be expressed as shown in Equation 10:

$$N = n \times \text{Width} \cdot (2L_{contact} + L_{Active}) \quad (10)$$

where, $$n(\text{Graphene}(20°\text{ C.})) = \frac{10^{12}}{cm^{12}} \text{ and } R_C = \frac{L_{Active}}{\pi}.$$

Based on this information and deriving for the total radiated power, an expression for the total radiated power is shown in Equation 11 with the total radiated power, $P_{rad}$, having units of Watts (W):

$$P_{rad} = 1.8318\left(\frac{\text{Width}(nm)(2L_{Contact}(nm) + L_{Active}(nm))}{L_{Active}(nm)}\right)^2 \times 10^{-16} W. \quad (11)$$

Based on Equations 1 through 11, TABLES I, II, & III summarize the performance characteristics for low, mid-range, and high range frequencies associated with embodiments of the invention.

TABLE I $f_{Low}$ = 0.3 THz, $L_{Active(fLOW)}$ = 1062.5 nm, & $d_{separation}$ = 1000 nm

| | | | |
|---|---|---|---|
| Width (nm) | 10 | 50 | 100 |
| $L_{Contact}$ (nm) | 10 | 50 | 100 |
| τ (sec) | 4.922 × 10⁻¹⁷ | 2.461 × 10⁻¹⁶ | 4.922 × 10⁻¹⁶ |
| $P_{rad}$ (W) | 1.901 × 10⁻¹⁴ | 5.482 × 10⁻¹³ | 2.586 × 10⁻¹² |

TABLE II $f_{MID}$ = 1.5 THz, $L_{Active(fMID)}$ = 212.5 nm, & $d_{separation}$ = 1000 nm

| | | | |
|---|---|---|---|
| Width (nm) | 10 | 50 | 100 |
| $L_{Contact}$ (nm) | 10 | 50 | 100 |
| τ (sec) | 2.461 × 10⁻¹⁶ | 1.231 × 10⁻¹⁵ | 2.461 × 10⁻¹⁵ |
| $P_{rad}$ (W) | 2.192 × 10⁻¹⁴ | 9.903 × 10⁻¹³ | 6.902 × 10⁻¹² |

TABLE III $f_{HIGH}$ = 3.0 THz, $L_{Active(fHIGH)}$ = 106.25 nm, & $d_{separation}$ = 1000 nm

| | | | |
|---|---|---|---|
| Width (nm) | 10 | 50 | 100 |
| $L_{Contact}$ (nm) | 10 | 50 | 100 |
| τ (sec) | 4.922 × 10⁻¹⁶ | 2.461 × 10⁻¹⁵ | 4.922 × 10⁻¹⁵ |
| $P_{rad}$ (W) | 2.586 × 10⁻¹⁴ | 1.725 × 10⁻¹² | 1.521 × 10⁻¹¹ |

It is apparent that embodiments of the invention are configurable to discriminate frequency and particularly in the terahertz region. The result is highly synchronized terahertz radiation that is predictable and well-regulated. Embodiments of the invention can be stand-alone or included in a layered or matrix orientation as well as two-dimensional or three-dimensional. Embodiments of the invention may also be presented as multiple layer structures fabricated by methods that have demonstrated capability for rapid scale-up for mass production of large area devices.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An emitter, comprising:
   a substrate;
   a layered half-cylinder associated with said substrate, said layered half-cylinder configured with a channel having a pre-determined channel length, wherein said substrate and layered half-cylinder are defined in a three-dimensional coordinate frame of reference defined by an x-axis, a y-axis, and a z-axis, wherein a central longitudinal axis of said layered half-cylinder is centered at an origin of said three-dimensional coordinate frame of reference;
   said layered half-cylinder, comprises:
   a first insulator layer bonded to said substrate;
   a conductor layer bonded to said first insulator layer;
   a second insulator layer bonded to said conductor layer;

an arcuate-shaped graphene layer having first and second surfaces, said first surface bonded to said second insulator layer along a pre-determined contact length;
wherein said pre-determined channel length corresponds to a distance between diametrically-opposing sides of said first surface of said arcuate-shaped graphene layer as measured perpendicular to said central longitudinal axis.

2. The emitter according to claim 1, wherein said substrate is a semiconductor substrate.

3. The emitter according to claim 1, wherein said substrate is silicon.

4. The emitter according to claim 1, wherein said channel is a semi-circular channel.

5. The emitter according to claim 1, said layered-half cylinder, further comprising:
wherein said conductor layer having a first portion and a second portion, wherein said first portion and said second portion are positioned diametrically-opposed from one another and separated by said channel;
wherein said second insulator layer having a first portion and a second portion, wherein said first portion and said second portion of said second insulator layer are positioned diametrically-opposed from one another and separated by said channel.

6. The emitter according to claim 1, said arcuate-shaped graphene layer, further comprising:
first and second tabs diametrically-opposed from each other, said first and second tabs separated by said channel;
wherein said first and second tabs are bonded to said second insulator layer along said pre-determined contact length, wherein said pre-determined contact length is defined by $L_{Contact}$ and is a range of about 10 to 100 nanometers along said x-axis; and
wherein said arcuate-shaped graphene layer has a width range in the y-direction of about 10 to 100 nanometers.

7. The emitter according to claim 6, wherein said arcuate-shaped graphene layer having an active length, $L_{Active}$, along said first surface in the x-z plane and defined by a radius of curvature, $R_C$, wherein $L_{Active}=\pi R_C$, wherein said active length, $L_{Active}$, is a range of about 100 to 1500 nanometers.

8. The emitter according to claim 7, wherein said pre-determined channel length of said half-cylinder is defined as $$2R_C = 2\frac{L_{Active}}{\pi},$$

perpendicular to said central longitudinal axis.

9. The emitter according to claim 1, wherein said layered half-cylinder is a right-circular cylinder.

10. An emitter, comprising:
a doped silicon substrate;
a layered half-cylinder associated with said doped silicon substrate, said layered half-cylinder configured with a channel having a pre-determined channel length, wherein said substrate and said layered half cylinder are defined in a three-dimensional coordinate frame of reference defined by an x-axis, a y-axis, and a z-axis, wherein a central longitudinal axis of said layered half-cylinder is centered at an origin of said three-dimensional coordinate frame of reference;
wherein said layered half-cylinder, comprises:
a reverse T-shaped deposited silicon layer bonded to said doped silicon substrate;
a first and a second L-shaped insulator layers having a horizontal and a vertical portion, wherein each of said first and second L-shaped insulator layers are bonded to said reverse T-shaped deposited silicon layer, wherein said horizontal and said vertical portions of said first and said second L-shaped insulator layers are positioned in intimate adjacent contact with said reverse T-shaped deposited silicon layers;
wherein said horizontal and said vertical portions of said first and said second L-shaped insulator layers are positioned outwardly away and diametrically-opposed from each other and separated by said reverse T-shaped deposited silicon layer;
a first and a second L-shaped conductor layers having a horizontal and a vertical portion, wherein each of said first and second L-shaped conductor layers are bonded to said first and said second L-shaped insulator layers, respectively, wherein said horizontal and said vertical portions of said first and said second L-shaped conductor layers are positioned in intimate adjacent contact with said first and said second L-shaped insulator layers, respectively;
wherein said horizontal and said vertical portions of said first and said second L-shaped conductor layers are positioned outwardly away and diametrically-opposed from each other;
a first and a second L-shaped silicon layers having a horizontal and a vertical portion, wherein each of said first and second L-shaped silicon layers are bonded to said first and said second L-shaped conductor layers, respectively, wherein said horizontal and said vertical portions of said first and said second L-shaped silicon layers are positioned in intimate adjacent contact with said first and said second L-shaped conductor layers, respectively;
wherein said horizontal and said vertical portions of said first and said second L-shaped silicon layers are positioned outwardly away and diametrically-opposed from each other;
a C-shaped graphene arch layer having first and second surfaces, said C-shaped graphene arch layer bonded to each of said vertical portions of each of said first and second L-shaped silicon layers, wherein said pre-determined channel length corresponds to a distance between diametrically-opposing sides of said first surface of said C-shaped graphene arch layer as measured perpendicular to said central longitudinal axis.

11. The emitter according to claim 10, wherein said channel is a semi-circular channel.

12. The emitter according to claim 10, further comprising:
wherein said bonding of said C-shaped graphene arch layer to said first and second L-shaped silicon layers is along a pre-determined contact length, wherein said pre-determined contact length is defined by $L_{Contact}$ and is a range of about 10 to 100 nanometers along said z-axis, along outward surfaces of each of said vertical portions;
wherein C-shaped graphene arch layer has a width range in the y-direction of about 10 to 100 nanometers.

13. The emitter according to claim 12, wherein said C-shaped graphene layer having an active length, $L_{Active}$, along said first surface in the x-z plane and defined by a radius of curvature, $R_C$, wherein $L_{Active}=\pi R_C$, wherein said active length, $L_{Active}$, is a range of about 100 to 1500 nanometers.

14. The emitter according to claim 13, wherein said predetermined channel length of said half-cylinder is defined as $$2R_C = 2\frac{L_{Active}}{\pi},$$

perpendicular to said central longitudinal axis.

* * * * *